United States Patent
Seo et al.

(10) Patent No.: US 11,670,387 B2
(45) Date of Patent: Jun. 6, 2023

(54) NON-VOLATILE MEMORY DEVICE, MEMORY SYSTEM INCLUDING THE DEVICE, AND METHOD OF OPERATING THE DEVICE

(71) Applicant: SAMSUNG ELECTRONICS CO., LTD., Suwon-si (KR)

(72) Inventors: Youngdeok Seo, Seoul (KR); Jinyoung Kim, Seoul (KR); Sehwan Park, Yongin-si (KR); Dongmin Shin, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 192 days.

(21) Appl. No.: 17/328,487

(22) Filed: May 24, 2021

(65) Prior Publication Data

US 2022/0139475 A1 May 5, 2022

(30) Foreign Application Priority Data

Oct. 30, 2020 (KR) ........................ 10-2020-0143867

(51) Int. Cl.
| | |
|---|---|
| *G11C 16/34* | (2006.01) |
| *G11C 16/26* | (2006.01) |
| *G06N 20/10* | (2019.01) |
| *G11C 16/08* | (2006.01) |
| *G11C 16/10* | (2006.01) |
| *G06F 18/214* | (2023.01) |

(52) U.S. Cl.
CPC ........ *G11C 16/3481* (2013.01); *G06F 18/214* (2023.01); *G06N 20/10* (2019.01); *G11C 16/08* (2013.01); *G11C 16/102* (2013.01); *G11C 16/26* (2013.01); *G11C 16/3404* (2013.01)

(58) Field of Classification Search
CPC ... G11C 16/3481; G11C 16/08; G11C 16/102; G11C 16/26; G11C 16/3404; G11C 11/5642; G11C 16/0483; G11C 16/10; G06F 18/214; G06N 20/10; G06N 3/08
See application file for complete search history.

(56) References Cited

U.S. PATENT DOCUMENTS

| | | | |
|---|---|---|---|
| 9,685,206 B2 * | 6/2017 | Choi | ................... G11C 16/26 |
| 9,922,706 B2 | 3/2018 | Zeng et al. | |
| 10,013,211 B2 | 7/2018 | Lee et al. | |
| 10,216,422 B2 | 2/2019 | Kim et al. | |

(Continued)

FOREIGN PATENT DOCUMENTS

KR 10-20200034123 A 3/2020

*Primary Examiner* — Jay W. Radke
(74) *Attorney, Agent, or Firm* — Sughrue Mion, PLLC

(57) ABSTRACT

A non-volatile memory device includes a memory cell array including memory cells, a page buffer circuit including page buffers respectively connected to bit lines, a buffer memory, and a control logic configured to control a read operation on the memory cells. In the read operation, the control logic obtains valley search detection information including read target block information and word line information by performing a valley search sensing operation on a distribution of threshold voltages of the memory cells, obtains a plurality of read levels using a read information model by inputting the valley search detection information into the read information model, and performs a main sensing operation for the read operation.

19 Claims, 15 Drawing Sheets

(56) References Cited

U.S. PATENT DOCUMENTS

| | | |
|---|---|---|
| 10,289,341 B2 | 5/2019 | Kirshenbaum et al. |
| 10,573,389 B2 | 2/2020 | Kim et al. |
| 10,613,795 B2 | 4/2020 | Oh et al. |
| 10,691,346 B2 | 6/2020 | Han |
| 10,811,075 B1* | 10/2020 | Cheng .................... G11C 7/222 |
| 11,556,415 B2* | 1/2023 | Park .................... G06F 11/1068 |
| 2019/0370639 A1 | 12/2019 | Yu |
| 2020/0098436 A1 | 3/2020 | Kim et al. |
| 2020/0118619 A1 | 4/2020 | Narayanan et al. |
| 2020/0151539 A1 | 5/2020 | Oh et al. |
| 2021/0202028 A1* | 7/2021 | Choi .................... G11C 29/021 |
| 2022/0130437 A1* | 4/2022 | Park .................... G11C 16/349 |
| 2022/0139475 A1* | 5/2022 | Seo ........................ G11C 16/26 |
| | | 365/185.22 |
| 2022/0189575 A1* | 6/2022 | Seo ...................... G11C 7/1039 |
| 2022/0222138 A1* | 7/2022 | Park ...................... G11C 16/26 |

* cited by examiner

NON-VOLATILE MEMORY DEVICE, MEMORY SYSTEM INCLUDING THE DEVICE, AND METHOD OF OPERATING THE DEVICE

CROSS-REFERENCE TO RELATED APPLICATION

This application is based on and claims priority from Korean Patent Application No. 10-2020-0143867, filed on Oct. 30, 2020, in the Korean Intellectual Property Office, the disclosure of which is incorporated herein in its entirety by reference.

BACKGROUND

The disclosure relates to a memory device, and more particularly, to a non-volatile memory device configured to infer read levels based on a machine learning model.

In recent years, the multi-functionalization of information communication devices has led to a need for large-capacity highly integrated memory devices. A memory device may include a plurality of page buffers configured to store data in memory cells or output data from the memory cells. The plurality of page buffers may be disposed in multi-stages structures. To improve the read reliability of the memory device, a valley search operation may be performed on the distribution of threshold voltages of memory cells. Due to the valley search operation, a read time may increase, and thus, the read performance of the memory device may be degraded.

SUMMARY

The disclosure provides a memory device, which may have improved read reliability while reducing a time required for a valley search operation on a distribution of threshold voltages of memory cells.

According to an aspect of the disclosure, there is provided a non-volatile memory device comprising: a memory cell array comprising memory cells; a page buffer circuit comprising page buffers respectively connected to bit lines; a buffer memory; and a control logic configured to: obtain valley search detection information including read target block information and word line information by performing a valley search sensing operation on a distribution of threshold voltages of the memory cells, obtain a plurality of read levels using a read information model by inputting the valley search detection information into the read information model, and perform a main sensing operation for a read operation based on the plurality of read levels, wherein the read information model is trained using a machine learning model by inputting the valley search detection information into the machine learning model, and the read information model infers the plurality of read levels for reading data from the memory cells.

According to another aspect of the disclosure, there is provided a memory system comprising: a non-volatile memory device configured to: obtain valley search detection information including read target block information and word line information by performing a valley search sensing operation on a distribution of threshold voltages of memory cells during a read operation on the memory cells, obtain a plurality of read levels using a read information model by inputting the valley search detection information into the read information model, and perform a main sensing operation for the read operation based on the plurality of read levels; and a computing device configured to train the read information model using a machine learning model by inputting the valley search detection information into the machine learning model, and inferring the plurality of read levels for reading data from the memory cells.

According to another aspect of the disclosure, there is provided a method of operating a non-volatile memory device comprising a plurality of memory cells, the method comprising: obtaining valley search detection information including read target block information and word line information by performing a valley search sensing operation on a distribution of threshold voltages of the memory cells; obtaining a plurality of read levels using a read information model by inputting the valley search detection information into the read information model; and performing a main sensing operation for a read operation based on the plurality of read levels, wherein the read information model is trained using a machine learning model by inputting the valley search detection information into the machine learning model, and the read information model infers a plurality of read levels for reading data of the memory cells.

According to another aspect of the disclosure, there is provided an apparatus comprising: a memory storing one or more instructions; and a processor configured to execute the one or more instructions to: obtain a representative valley search detection information corresponding to a representative valley in a distribution of threshold voltages of memory cells, obtain a plurality of read levels by inputting the representative valley search detection information into a read information model, which is trained by valley search detection information training data, and performing read operation based on the plurality of read levels.

BRIEF DESCRIPTION OF THE DRAWINGS

Embodiments of the disclosure will be more clearly understood from the following detailed description taken in conjunction with the accompanying drawings in which.

DETAILED DESCRIPTION OF THE EMBODIMENTS

Hereinafter, example embodiments will be described in detail with reference to the attached drawings.

Figure 1:
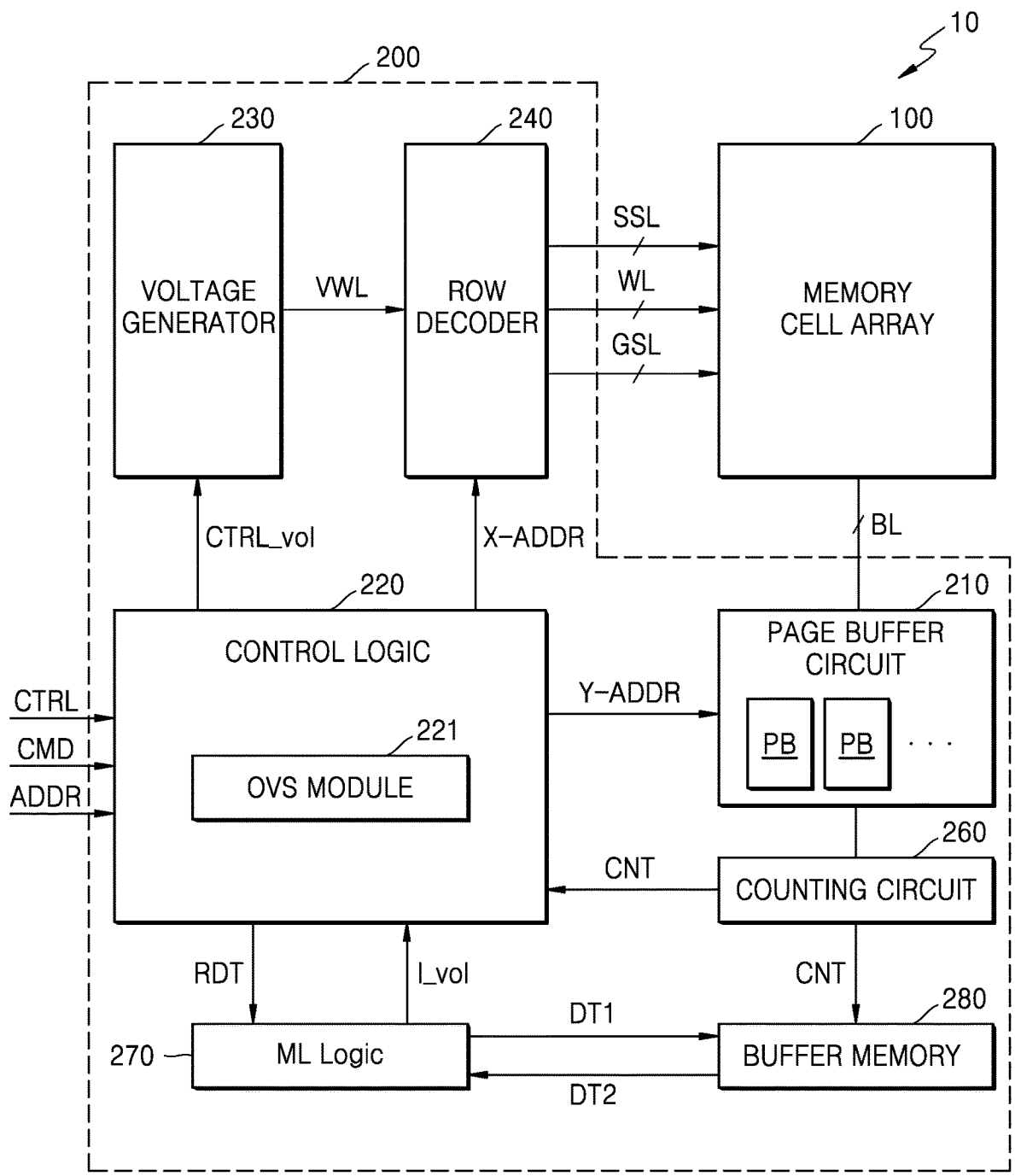
FIG. 1 is a block diagram of a non-volatile memory device according to an example embodiment.

FIG. 1 is a block diagram of a non-volatile memory device 10 according to an example embodiment. Referring to FIG. 1, the non-volatile memory device 10 may include a memory cell array 100 and a peripheral circuit 200. The peripheral circuit 200 may include a page buffer circuit 210, a control logic 220, a voltage generator 230, a row decoder 240, a counting circuit 260, a machine learning (ML) logic 270, and a buffer memory 280. Moreover, according to an example embodiment, the peripheral circuit 200 may further include a data input/output (I/O) circuit or an I/O interface.

The memory cell array 100 may be connected to the page buffer circuit 210 through bit lines BL and connected to the row decoder 240 through word lines WL, string selection lines SSL, and ground selection lines GSL. The memory cell array 100 may include memory cells. For example, the memory cells may be flash memory cells. Hereinafter, example embodiments in which a plurality of memory cells are NAND flash memory cells will be described in detail. However, the disclosure is not limited thereto. In some example embodiments, the plurality of memory cells may be resistive memory cells, such as resistive RAM (ReRAM) cells, phase-change RAM (PRAM) cells, or magnetic RAM (MRAM) cells.

In an example embodiment, the memory cell array 100 may include a three-dimensional (3D) memory cell array, which includes a plurality of NAND strings. Each of the NAND strings may include memory cells respectively connected to word lines stacked on a substrate in a perpendicular direction. The following patent documents, which are hereby incorporated in their entireties by reference, disclose suitable configurations for 3D memory cell arrays, in which the 3D memory cell array is configured at a plurality of levels, with word lines and/or bit lines shared between levels: U.S. Pat. Nos. 7,679,133; 8,553,466; 8,654,587; 8,559,235; and US Patent Application Publication No. 2011/0233648. However, the disclosure is not limited thereto. In some example embodiments, the memory cell array 100 may include a two-dimensional (2D) memory cell array.

The control logic 220 may include a valley search module 221. The valley search module 221 may perform a bit line precharge operation, a valley search sensing operation for searching for an optimum valley, an operation of determining a read level, and a main sensing operation for a read operation. The valley search module 221 may perform a valley search sensing operation on only a representative valley using an ML model and infer read levels of the remaining valleys. As such, the valley search module 221 omits performing the valley search sensing operation for searching for the optimum valley and the operation of determining the read level with respect to the remaining valleys.

The control logic 220 may output various control signals (e.g., a voltage control signal CTRL_vol, a row address X-ADDR, and a column address Y-ADDR) for programing data to the memory cell array 100, reading data from the memory cell array 100, or erasing data stored in the memory cell array 100 to the memory cell array 100, based on a command CMD, an address ADDR, and a control signal CTRL. Thus, the control logic 220 may control all various operations of the non-volatile memory device 10.

The voltage generator 230 may generate various kinds of voltages for performing program, read, and erase operations on the memory cell array 100, based on the voltage control signal CTRL_vol. Specifically, the voltage generator 230 may generate word line voltages VWL, for example, a program voltage, a read voltage, a pass voltage, an erase verification voltage, and a program verification voltage and further generate a string selection line voltage and a ground selection line voltage.

In response to the row address X-ADDR, the row decoder 240 may select one of a plurality of memory blocks, select one of a plurality of word lines WL of the selected memory block, and select one of a plurality of string selection lines SSL. The page buffer circuit 210 may select some bit lines out of the bit lines BL in response to the column address Y-ADDR. Specifically, the page buffer circuit 210 may operate as a write driver or a sense amplifier depending on an operation mode.

The page buffer circuit 210 may include a plurality of page buffers PB respectively connected to a plurality of bit lines BL. In an embodiment, the plurality of page buffers PB may be arranged in a matrix form including a plurality of columns and a plurality of rows.

The counting circuit 260 may count a first number of memory cells included in a region having a first threshold voltage based on a result of a first sensing operation on page buffers PB of a first group, and count a second number of memory cells included in a region having a second threshold voltage based on a result of a second sensing operation on page buffers PB of a second group. The counting circuit 260 may provide a counting result CNT corresponding to the first number and the second number to the control logic 220.

The control logic 220 may receive the counting result CNT corresponding to the first number and the second number, compare the first number with the second number, and perform a valley search operation on a distribution of threshold voltages of memory cells. A valley search operation performed by the non-volatile memory device 10 may be referred to as an 'on-chip valley search (OVS)' operation. Also, the control logic 220 may vary a develop time of the page buffers PB based on a result of the valley search operation. Specifically, the control logic 220 may vary next develop times of the page buffers PB of the first group and the page buffers PB of the second group. In addition, the control logic 220 may vary develop times of page buffers PB of other stages based on a result of a valley search operation performed using page buffers PB of one stage.

In the read operation, the control logic 220 may perform a valley search sensing operation on a distribution of threshold voltages of memory cells. The valley search sensing operation may include counting the first number of memory cells included in the region having the first threshold voltage lower than a reference value having a first read level, counting the second number of memory cells included in the region having the second threshold voltage higher than the reference value having the first read level, and calculating an optimum offset value having the first read level by comparing the first number with the second number.

The control logic 220 may generate valley search detection information including read target block information and word line information.

The control logic 220 may generate a plurality of read levels using a read information model by inputting the valley search detection information into the read information model. The read information model may be trained using the ML model by inputting the read target block information, the word line information, and the valley search detection information into the ML model, and infer a plurality of read levels for reading data from the memory cells. The read information model may include an ML model using at least one of a decision tree, a neural network, a support vector machine, and linear regression.

In the read operation, the control logic 220 may perform a valley search sensing operation on the first read level, generate the valley search detection information including the read target block information and the word line information, and infer a second read level using the read information model by inputting the valley search detection information into the read information model. In this case, the first read level may be a read level of the representative valley input into the read information model, and the second read level may be a read level of the remaining valleys other than the representative valley.

The control logic 220 may perform a main sensing operation for a read operation. In a read recovery operation performed when the read operation has failed, the control logic 220 may perform a valley search sensing operation on the first read level, generate the valley search detection information including the read target block information and the word line information, and infer the second read level using the read information model by inputting the valley search detection information into the read information model.

The ML logic 270 may include an ML model. The ML logic 270 may receive data RDT including an OVS sensing value of the representative valley from the control logic 220, and provide data I_vol, which is obtained by inferring optimum read levels of the remaining valleys, to the control logic 220. The ML logic 270 may be included in the control logic 220.

The buffer memory 280 may store the ML model and parameters, intermediate products, and result values DT1, which are used during the process of inferring the read levels using the ML model. The ML model and the parameters, the intermediate products, and the result values DT1, which are used during the process of inferring the read levels using the ML model, may be stored also in the memory cell array 100. The buffer memory 280 may provide input data DT2 including the counting result CNT, which is needed for the ML model to infer the read level, to the ML logic 270.

Figure 2:
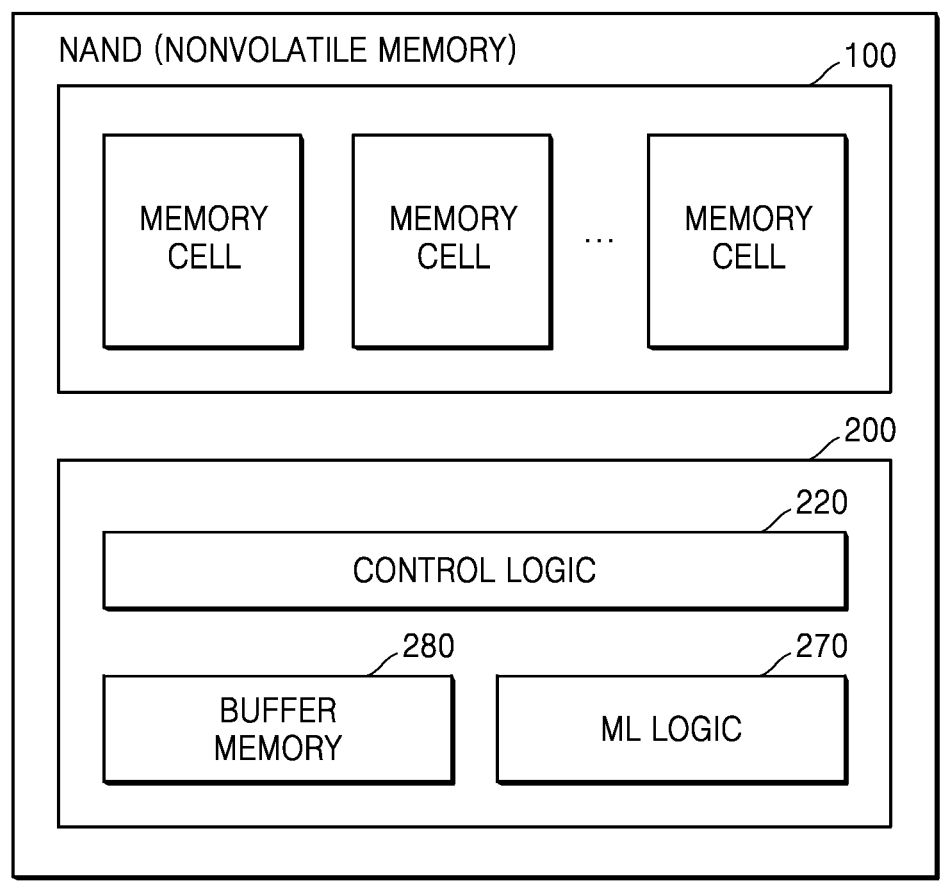
FIG. 2 is a block diagram of a non-volatile memory device according to an example embodiment.

FIG. 2 is a block diagram of a non-volatile memory device 10 according to an example embodiment.

The non-volatile memory device 10 may be a bonding vertical NAND (BVNAND) memory device having a chip-to-chip (C2C) structure. The C2C structure may be developed by manufacturing an upper chip including a cell region CELL 100 on a first wafer, manufacturing a lower chip including a peripheral circuit region PERI 200 on a second wafer, which is different from the first wafer, and connecting the upper chip to the lower chip by using a bonding technique. As an example, the bonding technique may refer to a method of electrically connecting a bonding metal formed on an uppermost metal layer of the upper chip to a bonding metal formed on an uppermost metal layer of the lower chip.

When a BVNAND C2C structure is used, a more sophisticated logic process may be applied to the peripheral circuit region PERI 200 than to a cell over periphery (COP) structure of the related art, and it may be easy to customize the cell region CELL 100 and the peripheral circuit region PERI 200. In a process of the related art, most operations are assigned to a controller. However, when a logic process is used for the peripheral circuit region PERI 200, a memory may directly perform various operations required for the memory, thereby causing performance improvement, such as a reduction in delay time.

Referring to FIG. 2, components according to example embodiments may be implemented on the non-volatile memory device 10. For example, a control logic 220, a buffer memory 280, and an ML logic 270 may be on the peripheral circuit region PERI 200. The ML logic 270 may include at least one of a multiply-accumulate (MAC) operator, a quantizer, and a weight decoder.

Figure 3:
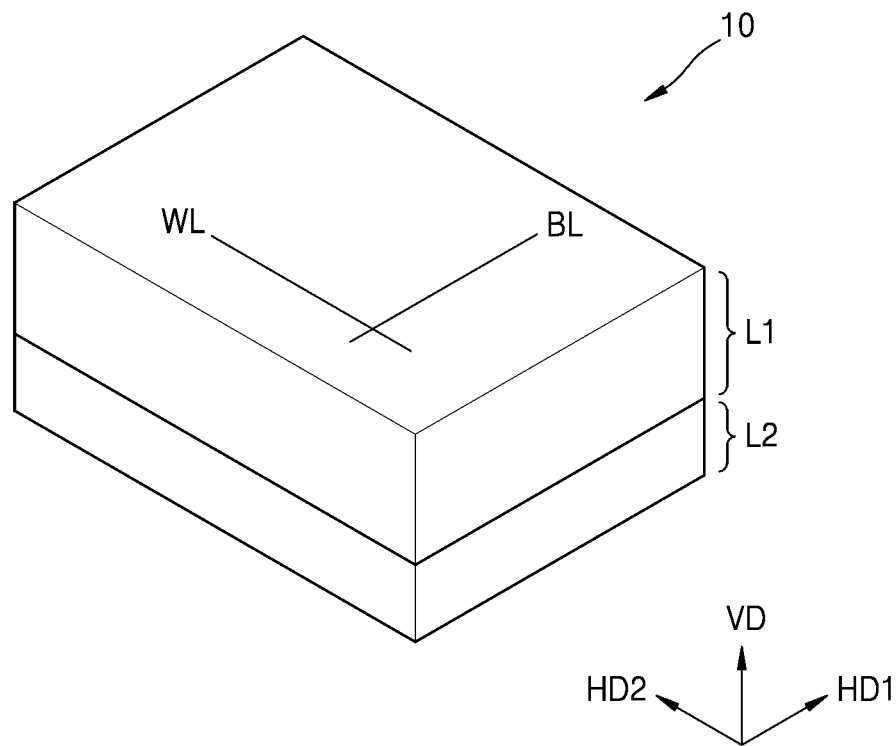
FIG. 3 is a schematic diagram of a structure of the non-volatile memory device of FIG. 1, according to an example embodiment.

FIG. 3 is a schematic diagram of a structure of the non-volatile memory device 10 of FIG. 1, according to an example embodiment.

Referring to FIG. 3, the non-volatile memory device 10 may include a first semiconductor layer L1 and a second semiconductor layer L2. The first semiconductor layer L1 may be stacked on the second semiconductor layer L2 in a vertical direction VD. Specifically, the second semiconductor layer L2 may be under the first semiconductor layer L1 in the vertical direction VD, and thus, the second semiconductor layer L2 may be close to a substrate. In an example embodiment, the memory cell array 100 of FIG. 1 may be formed in the first semiconductor layer L1, and the peripheral circuit 200 of FIG. 1 may be formed in the second semiconductor layer L2. Accordingly, the non-volatile memory device 10 may have a structure in which the memory cell array 100 is over the peripheral circuit 200, that is, a cell-over periphery (COP) structure. The COP structure may effectively reduce a horizontal area and increase the integration density of the non-volatile memory device 10.

In an example embodiment, the second semiconductor layer L2 may include a substrate. Transistors and metal patterns configured to wire the transistors may be formed on the substrate, and thus, the peripheral circuit 200 may be formed in the second semiconductor layer L2. After the peripheral circuit 200 is formed in the second semiconductor layer L2, the first semiconductor layer L1 including the memory cell array 100 may be formed, and metal patterns configured to electrically connect word lines WL and bit lines BL of the memory cell array 100 to the peripheral circuit 200 formed in the second semiconductor layer L2 may be formed. For example, the bit lines BL may extend in a first lateral direction HD1, and the word lines WL may extend in a second lateral direction HD2.

With the development of semiconductor processes, as the number of stages of memory cells disposed in the memory cell array 100 increases, that is, as a stacked number of word lines WL increases, an area of the memory cell array 100 may be reduced, and thus, an area of the peripheral circuit 200 may also be reduced.

Figure 4:
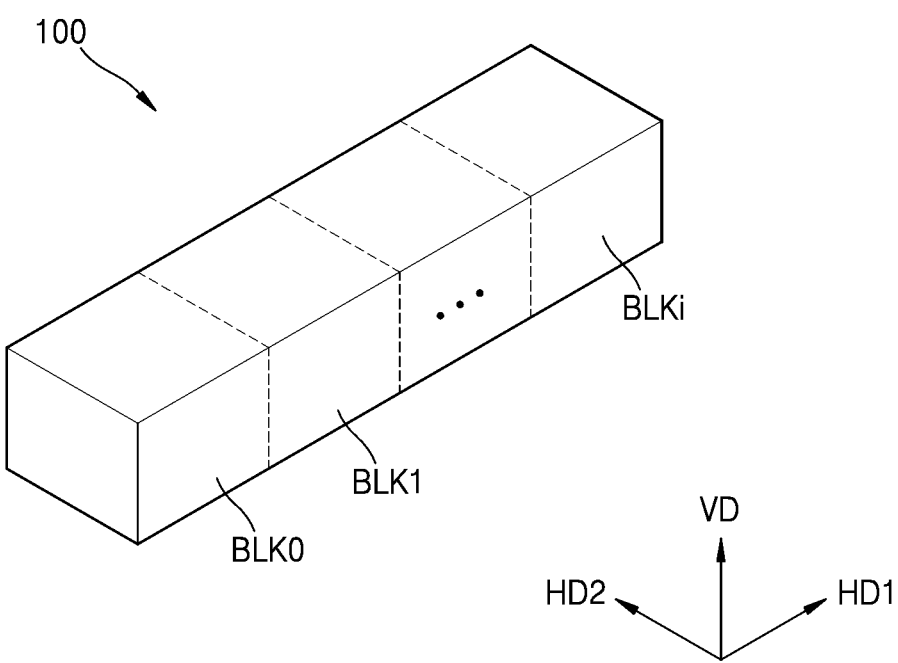
FIG. 4 is a diagram of a memory cell array of FIG. 1, according to an example embodiment.

FIG. 4 is a diagram of a memory cell array 100 of FIG. 1, according to an example embodiment.

Referring to FIG. 4, the memory cell array 100 may include memory blocks BLK0 to BLKi (here, i is a positive integer), each of which may have a 3D structure (or a vertical structure). Each of the memory blocks BLK0 to BLKi may include a plurality of NAND strings that extend in a vertical direction VD. The memory blocks BLK0 to BLKi may be selected by the row decoder (refer to 240 in FIG. 1).

Figure 5A:
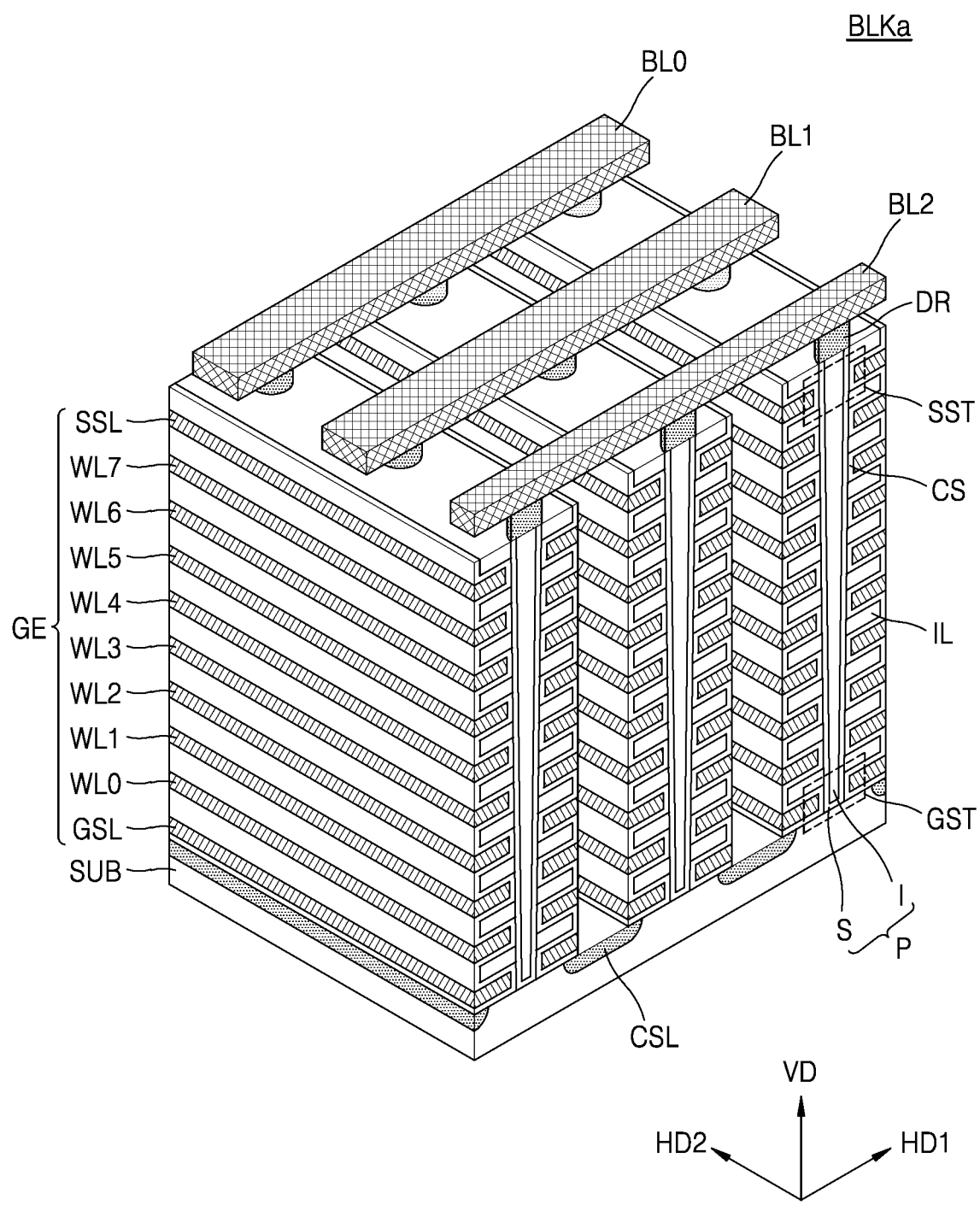
FIGS. 5A and 5B are perspective views of memory blocks according to example embodiments.

FIG. 5A is a perspective view of a memory block BLKa according to an example embodiment.

Referring to FIG. 5A, the memory block BLKa may be formed in a direction perpendicular to a substrate SUB. A common source line CSL may be provided on the substrate SUB and extend in a second lateral direction HD2. A plurality of insulating films IL may be sequentially provided in a vertical direction VD on a region of the substrate SUB between two adjacent common source lines CSL and extend in the second lateral direction HD2. The plurality of insulating films IL may be a predetermined distance apart from each other in the vertical direction VD. A plurality of pillars P may be sequentially provided in a first lateral direction HD1 on the region of the substrate SUB between the two adjacent common source lines CSL. The plurality of pillars P may pass through the plurality of insulating films IL in the vertical direction VD. A surface layer S of each of the pillars P may include a silicon material having a first type and function as a channel region. Meanwhile, an inner layer I of each of the pillars P may include an insulating material (e.g., silicon oxide) or an air gap.

A charge storage layer CS may be provided along exposed surfaces of the insulating films IL, the pillars P, and the substrate SUB on the region of the substrate SUB between the two adjacent common source lines CSL. For example, the charge storage layer CS may have an oxide-nitride-oxide (ONO) structure. Also, gate electrodes GE, such as selection lines GSL and SSL and word lines WL0 to WL7, may be provided on an exposed surface of the charge storage layer CS on the region of the substrate SUB between the two adjacent common source lines CSL. Drains DR may be respectively provided on the plurality of pillars P. Bit lines BL1 to BL3 may be provided on the drains DR and extend in the first lateral direction HD1.

Figure 5B:
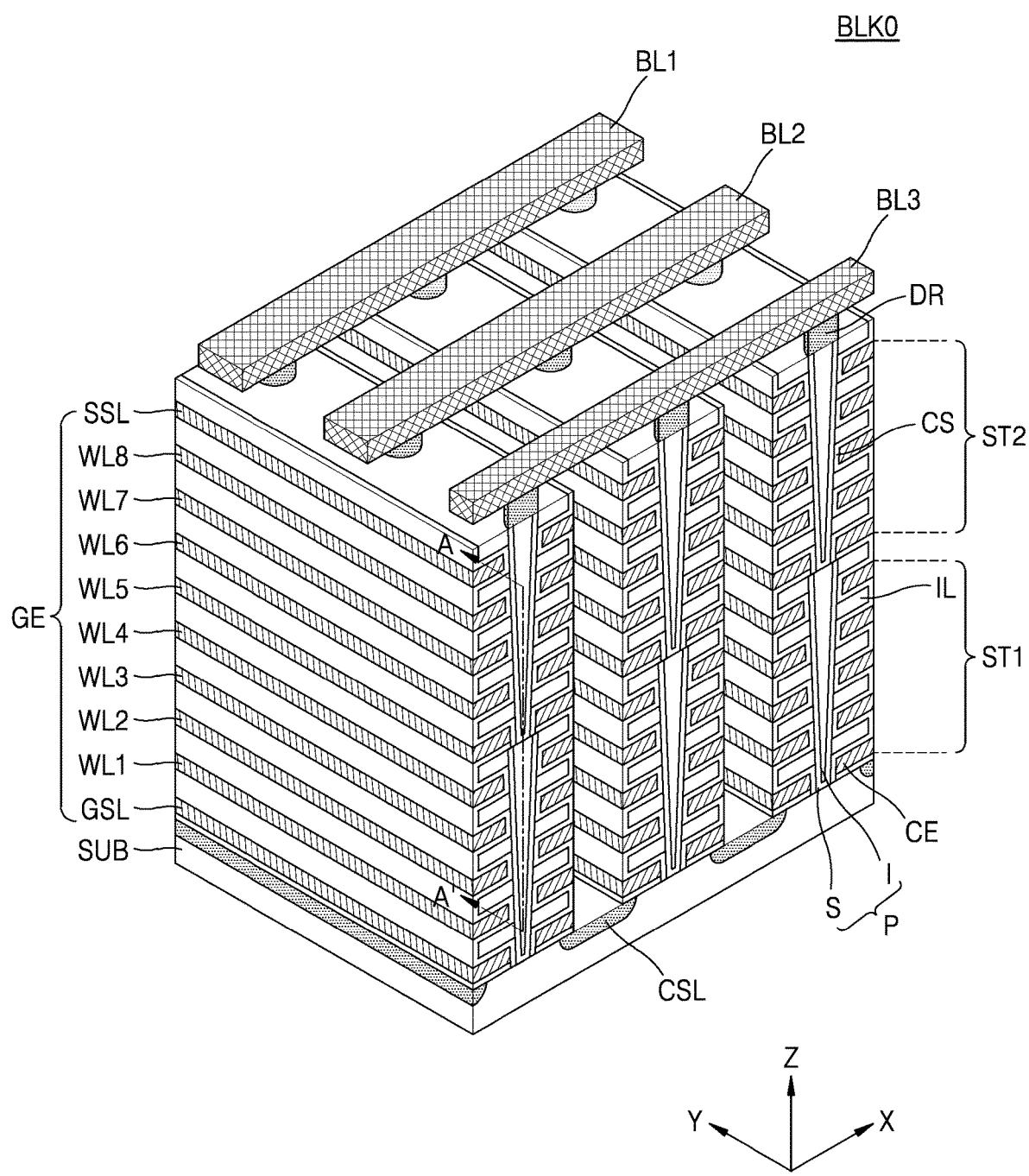

FIG. 5B is a perspective view of a memory block BLK0 according to an embodiment.

Referring to FIG. 5B, each memory block BLK0 included in a memory cell array (e.g., 100 in FIG. 1) may be formed in a direction perpendicular to a substrate SUB. The memory cell array (refer to 100 in FIG. 1) may include a first memory stack ST1 and a second memory stack ST2, which are stacked in a vertical direction. Although FIG. 5B illustrates a case in which the memory block BLK0 includes two selection lines GSL and SSL, eight word lines WL1 to WL8, and three bit lines BL1 to BL3, the memory block BLK0 may actually include more or fewer selection lines, word lines, and bit lines than those illustrated in FIG. 5B.

The substrate SUB may have a first conductive type (e.g., p type). Common source lines CSL may be provided on the substrate SUB and extend in a first direction (e.g., Y direction). The common source lines CSL may be doped with impurities of a second conductive type (e.g., n type).

The first memory stack ST1 may be provided on the substrate SUB. Specifically, a plurality of insulating films IL may be sequentially provided in a third direction (e.g., a Z direction) on a region of the substrate SUB between two adjacent common source lines CSL and extend in the first direction. The plurality of insulating films IL may be a predetermined distance apart from each other in the third direction. For example, the plurality of insulating films IL may include an insulating material, such as silicon oxide. A plurality of pillars P may be sequentially arranged in the first direction on the region of the substrate SUB between the two adjacent common source lines CSL. The plurality of pillars P may be formed by using an etching process to pass through the plurality of insulating films IL in the third direction. For example, the plurality of pillars P may pass through the plurality of insulating films IL and be in contact with the substrate SUB. Specifically, a surface layer S of each of the pillars P may include a silicon material having a first type and function as a channel region. Moreover, an inner layer I of each of the pillars P may include an insulating material (e.g., silicon oxide) or an air gap.

A charge storage layer CS may be provided along exposed surfaces of the insulating films IL, the pillars P, and the substrate SUB in the region of the substrate SUB between the two adjacent common source lines CSL. The charge storage layer CS may include a gate insulating layer (or referred to as a 'tunneling insulating layer'), a charge trap layer, and a blocking insulating layer. For example, the charge storage layer CS may have an ONO structure. In addition, gate electrodes GE, such as selection lines GSL and SSL and word lines WL1 to WL4, may be provided on an exposed surface of the charge storage layer CS on the region of the substrate SUB between the two adjacent common source lines CSL.

The memory block BLK0 according to the present embodiment may further include the second memory stack ST2, which is formed on the first memory stack ST1 using the same method as the first memory stack ST1 described above. Drains (or drain contacts) DR may be respectively provided on the plurality of pillars P that extend to the second memory stack ST2. For example, the drains (or the drain contacts) DR may include a silicon material doped with impurities having the second conductive type. The bit lines BL1 to BL3 may be on the drains DR and extend in a second direction (e.g., X direction). The bit lines BL1 to BL3 may be a predetermined distance apart from each other in the first direction.

Figure 6:
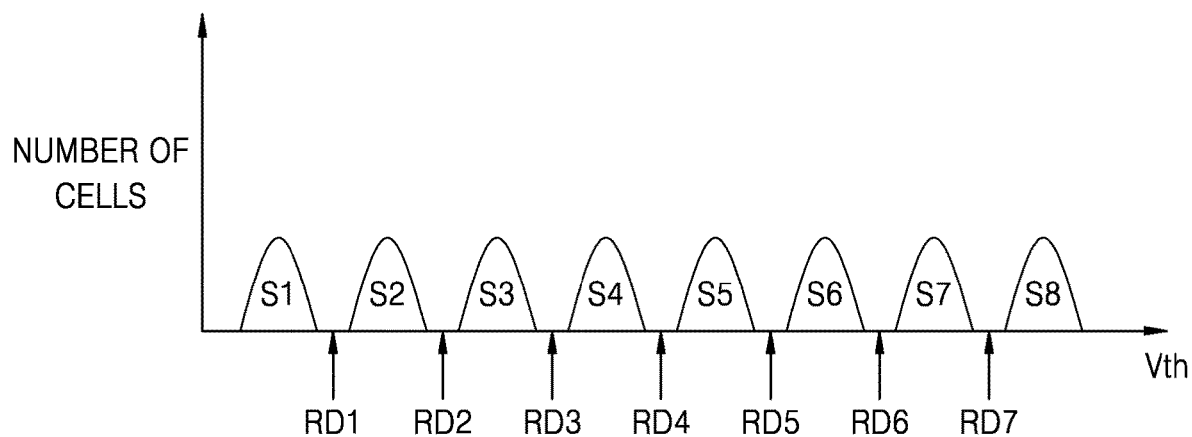
FIG. 6 is a graph showing a distribution of threshold voltages of memory cells, according to an example embodiment.

FIG. 6 is a graph showing a distribution of threshold voltages of memory cells, according to an example embodiment.

FIG. 6 shows distributions of threshold voltages of memory cells connected to word lines. In FIG. 6, the abscissa denotes threshold voltages of the memory cells, and the ordinate denotes cell counts, that is, the number of memory cells. Referring to FIGS. 1 and 5A, a word line may be included in one block of the non-volatile memory device 10. A memory cell connected to the word line may be programmed with at least one bit. A memory cell may be categorized as a single-level cell (SLC), a multi-level cell (MLC), a triple-level cell (TLC), or a quad-level cell (QLC) depending on the number of bits stored in the memory cell. The memory cell may be in a plurality of states depending on the number of bits stored in the memory cell. Each of the plurality of states may be defined by a range of a threshold voltage. In FIG. 6, it is assumed that the memory cell is a TLC and a threshold voltage of the memory cell may be programmed to one of eight states S1 to S8. However, the disclosure is not limited thereto.

After data is written to the memory cell, disturbance or retention degradation may occur in the memory cell. The disturbance may refer to a phenomenon where threshold voltages of memory cells change due to program, read, erase, and coupling, which occur around memory cells. The retention degradation may refer to a phenomenon where a threshold voltage of a memory cell changes due to the leakage of trapped charges over time after the memory cell is programmed by trapping the charges in a charge trap layer of the memory cell. When the memory cell is degraded, the threshold voltage of the memory cell may move, and thus, data may not be read from the memory cell using initialized read levels. For example, the threshold voltage of the memory cell may be changed as shown in FIG. 7.

When the memory cells exhibit the distributions of threshold voltages as shown in FIG. 6, optimum read levels for reading data stored in the memory cells may be RD1 to RD7. Curves of FIG. 6 may be changed or moved due to degradation.

In an example embodiment, the control logic (e.g., 220 of FIG. 1) may calculate the optimum read levels RD1 to RD7 for determining the states S1 to S8 based on a degradation state of the block corresponding to a curve and a number assigned to a word line WL using the valley search module 221.

Figure 7:
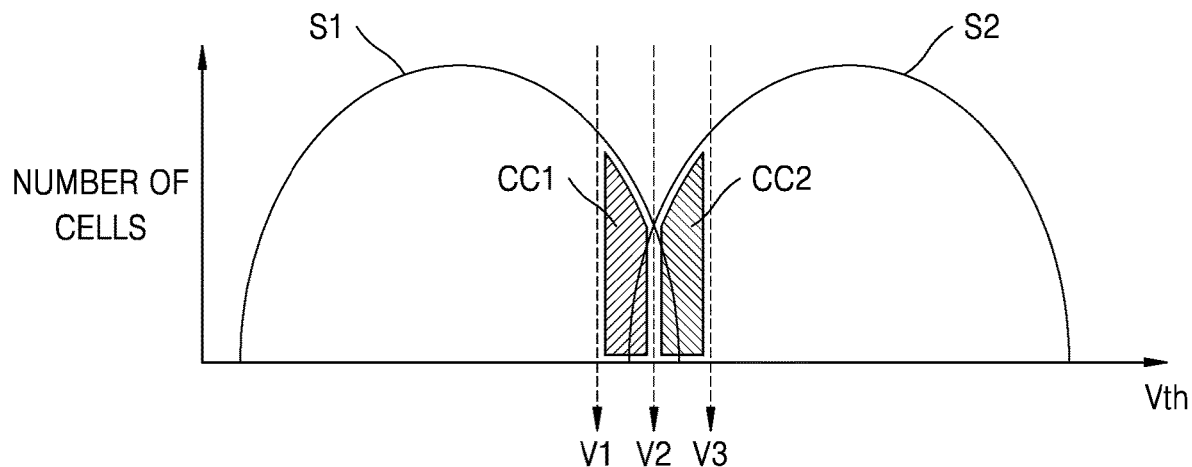
FIG. 7 is a graph showing a method of determining a read voltage, according to an example embodiment.

FIG. 7 is a graph showing a method of determining a read voltage, according to an example embodiment.

Referring to FIG. 7, the abscissa denotes a threshold voltage Vth, and the ordinate denotes the number of memory cells. For example, a distribution of threshold voltages of a non-volatile memory device (refer to memory device 10 in FIG. 1) may have a plurality of states including a first state S1 and a second state S2. In this case, a counting circuit (refer to counting circuit 260 in FIG. 1) may count a first number CC1 of memory cells included in a first cell count region between a first voltage level V1 and a second voltage level V2. The counting circuit 260 may count a second number CC2 of memory cells included in a second cell count region between the second voltage level V2 and a third voltage level V3.

A control logic (refer to control logic 220 in FIG. 1) may obtain the first number CC1 of memory cells included in the first cell count region and the second number CC2 of memory cells included in the second cell count region, compare the first number CC1 with the second number CC2, and determine an optimum read level.

Figure 8A:
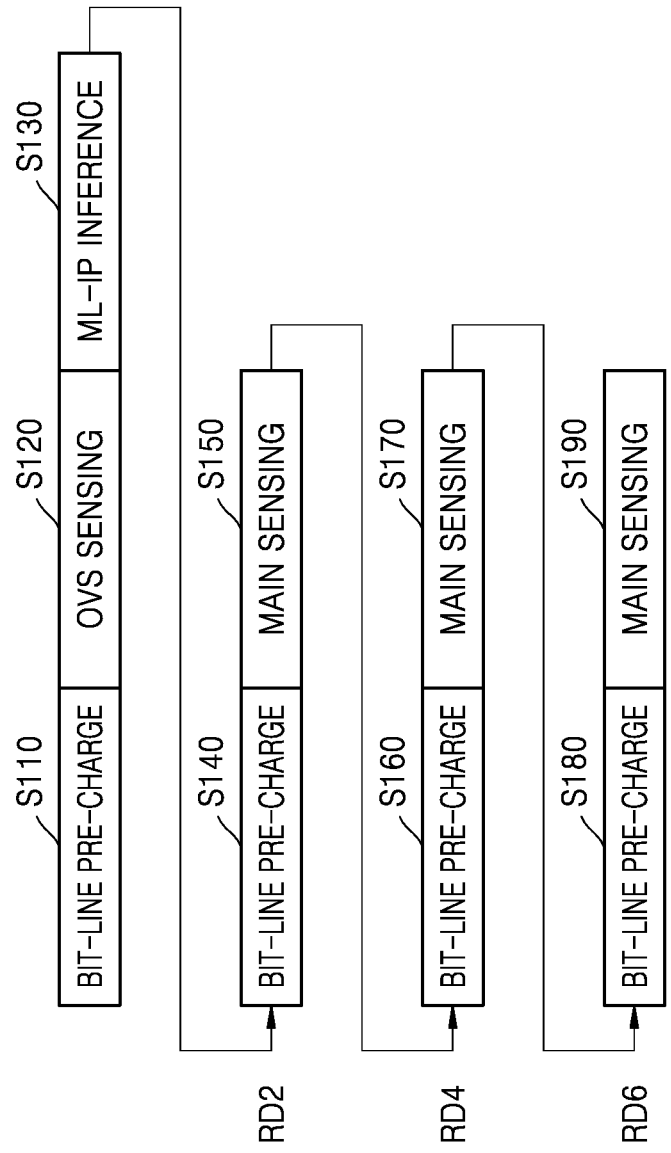
FIGS. 8A and 8B are diagrams of a method of replacing some operations of a valley sensing process by an operation using an ML model, according to an example embodiment.
Figure 8B:
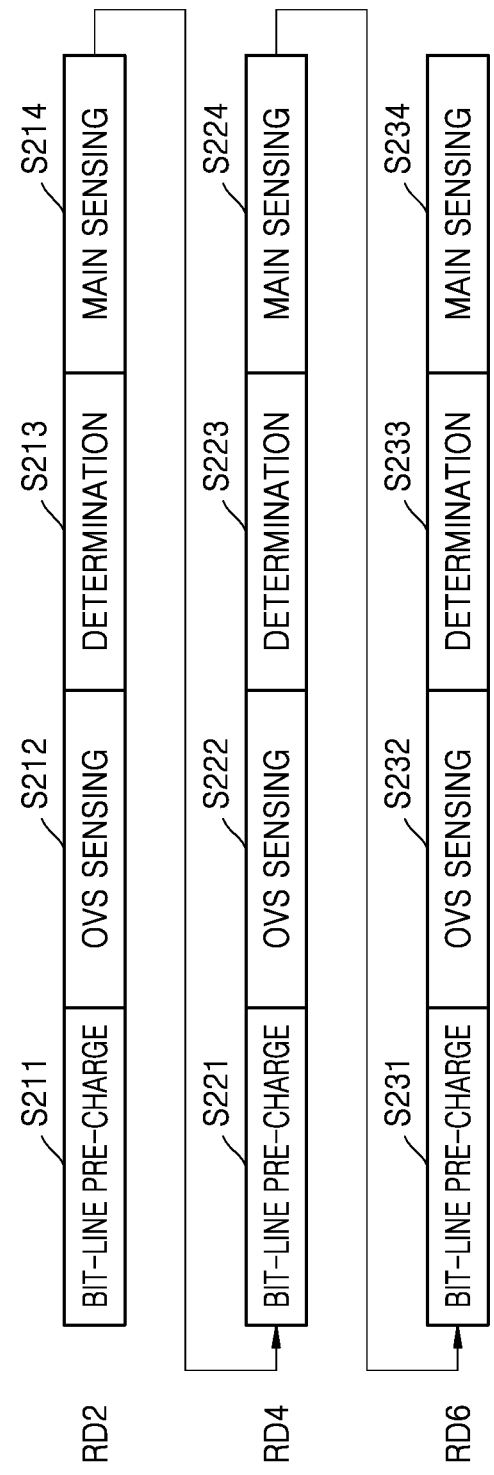

FIGS. 8A and 8B are a method of replacing some operations of a valley sensing process by an operation using an ML model, according to an example embodiment.

FIG. 8A illustrates an operation using an ML model, which replaces some operations of an OVS process of the related art, in order to perform a read operation on a first valley, a second valley, and a third valley of a first page in a first memory cell. According to an example embodiment, the first page is a central significant bit (CSB) page) and the first memory cell is TLC.

According to an example embodiment, the method may include performing a bit line precharge operation S110, an OVS sensing operation S120 and inference performance operation during a process of training the ML model S130.

Although the bit line precharge operation S110 is the same as in the OVS process of the related art, an OVS sensing operation S120 may be performed only once on a representative valley. For example, the representative valley may select one of a lowest read level VO1, a highest read level V03, and a middle read level VO2 in a page, and an arbitrary representative valley may be selected by referring to inference performance during a process of training the ML model. Optimum read levels VO1, V02, and VO3 of a plurality of valleys may be inferred using the ML model by inputting a value of the representative valley, which is measured in the OVS sensing operation S120, into the ML model (S130). Thereafter, an OVS sensing operation or an operation of determining an optimum read level may not be performed on each valley, and bit line precharge operation S140, 160 and S180 and main sensing operations S150, S170, and S190 may be performed based on an inferred read level of each valley.

FIG. 8B illustrates a comparative example of a read operation on a first valley, a second valley, and a third valley of a first page in a first memory cell. The OVS process of the related art may involve performing an OVS operation on each valley in a read operation. The first page may include three valleys, that is, the first valley, the second valley, and the third valley. After optimum read levels VO1, V02, and VO3 of all valleys are corrected, the read operation may be performed. Accordingly, in the first memory cell, a bit line precharge operation S211, an OVS sensing operation S212, an operation S213 of determining the optimum read level VO1, and a main sensing operation S214 for a read operation may be performed on the first valley. Also, bit line precharge operations S221 and S231, OVS sensing operations S222 and S232, operations S223 and S233 of determining optimum read levels, and main sensing operations S224 and S234 for a read operation may be respectively performed on the second valley and the third valley.

For example, a QLC NAND memory cell may have three or four valleys for each page. As the number of bits stored in the QLC NAND memory cell increases, an OVS sensing operation and an optimum read-level determination operation may be repeated more, and thus, a delay time of a read operation may further increase. When a read level is inferred using the ML model according to the present embodiment, a process of repeating an OVS sensing operation and an optimum read-level determination operation on each valley may be replaced by a process of performing an OVS sensing operation on a representative valley and inferring read levels of a plurality of valleys, thereby minimizing a time delay.

Figure 9:
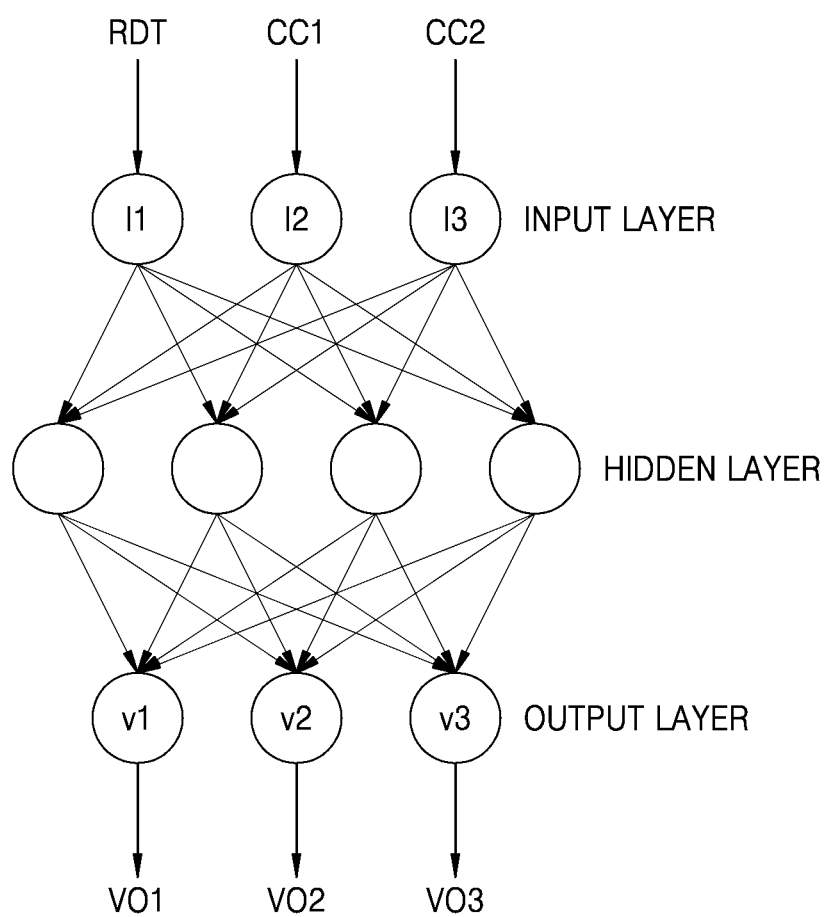
FIG. 9 is a diagram of a structure of a machine learning (ML) model, according to an example embodiment.

FIG. 9 is a diagram of a structure of an ML model, according to an example embodiment.

Referring to FIGS. 7 and 9, the ML model may be trained by inputting an OVS sensing value data RDT of a representative valley, which may include block information, word line information, a first number CC1 of memory cells included in a first cell count region, and a second number CC2 of memory cells included in a second cell count region, and infer optimum read levels V01, V02, and VO3 of each valley.

The ML model may include input nodes I1 to I3, which form an input layer, hidden nodes, which form at least one hidden layer, and output nodes v1 to v3, which form an output layer. Although one-stage hidden layer is illustrated in FIG. 9 for a rapid operation, the numbers and structures of hidden nodes and hidden layers may depend on inference requirements including a delay time and resolution and the performance of a memory device.

In addition, to lighten model parameters, the ML model may be trained to infer read levels of all valleys instead of inferring a read level for each page (a least significant bit (LSB) page, a central significant bit (CSB) page, or a most significant bit (MSB) page).

Figure 10:
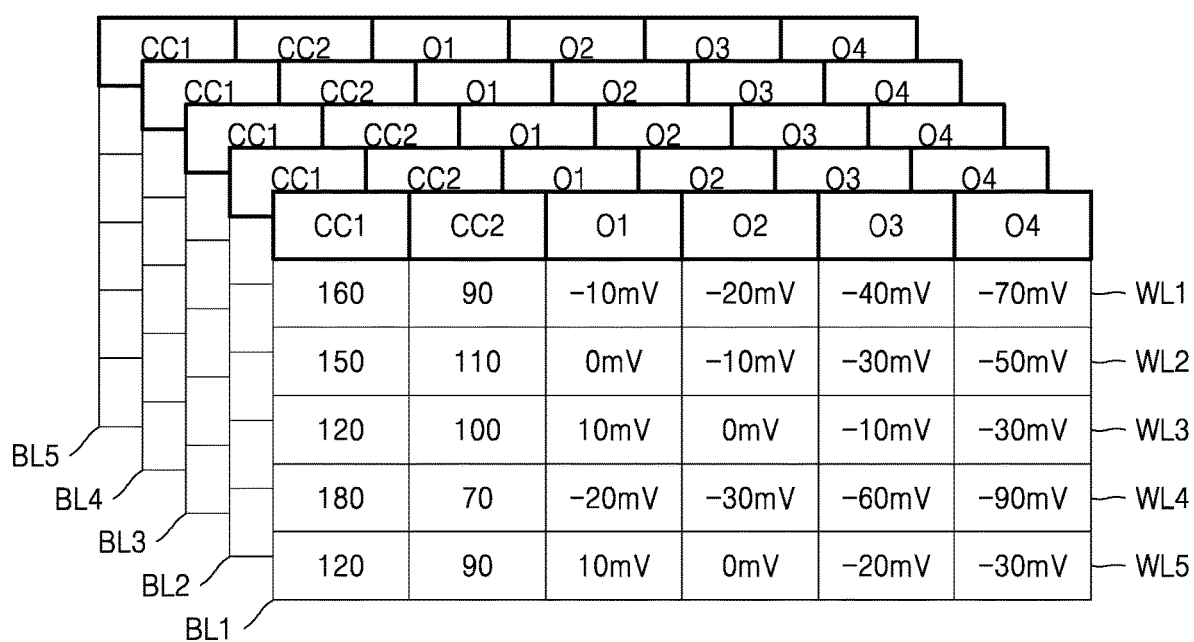
FIG. 10 is a diagram of training data of an ML model, according to an example embodiment.

FIG. 10 is a diagram of training data of an ML model, according to an example embodiment.

According to an example embodiment, data included in input nodes to train the ML model for inferring a read level may include block information, word line information, a first number CC1 of memory cells included in a first cell count region, and a second number CC2 of memory cells included in a second cell count region. To improve the inference accuracy of the ML model, input data may further include target memory block information, target page information, target word line information, timestamp information, program and erase number information, read count information, inferred read level information, read operation error information, and information about a read recovery operation performed when a read operation has failed.

FIG. 10 illustrates a table showing the configuration of training data based on a QLC memory. Under the condition that a first number CC1 is preset to 160 and a second number CC2 is preset to 90 as a result of an OVS sensing operation on a first word line WL1, it may be determined that an offset O1 of a first read level is −10 mV, an offset O2 of a second read level is −20 mV, an offset O3 of a third read level is −40 mV, and an offset O4 of a fourth read level is −70 mV.

Under the condition that the first number CC1 is preset to 150 and the second number CC2 is preset to 110 as a result of an OVS sensing operation on a second word line WL2, it may be determined that the offset O1 of the first read level is 0 mV, the offset O2 of the second read level is −10 mV, the offset O3 of the third read level is −30 mV, and the offset O4 of the fourth read level is −50 mV.

Although the training data of FIG. 10 is configured based on the first read level, the second read level, the third read level, and the fourth read level, which are included in an LSB page of the QLC memory, from among 15 valleys, the training data is not limited to a memory structure including the number of pages or valleys and may be configured in various forms.

An offset of a read level that is determined for each valley may be correlated with data, such as word line information, block information, and program-erase counts, other than the first number CC1 and the second number CC2, which are the result of the OVS sensing operation. Accordingly, additional data may be included in the training data of the ML model.

Figure 11A:
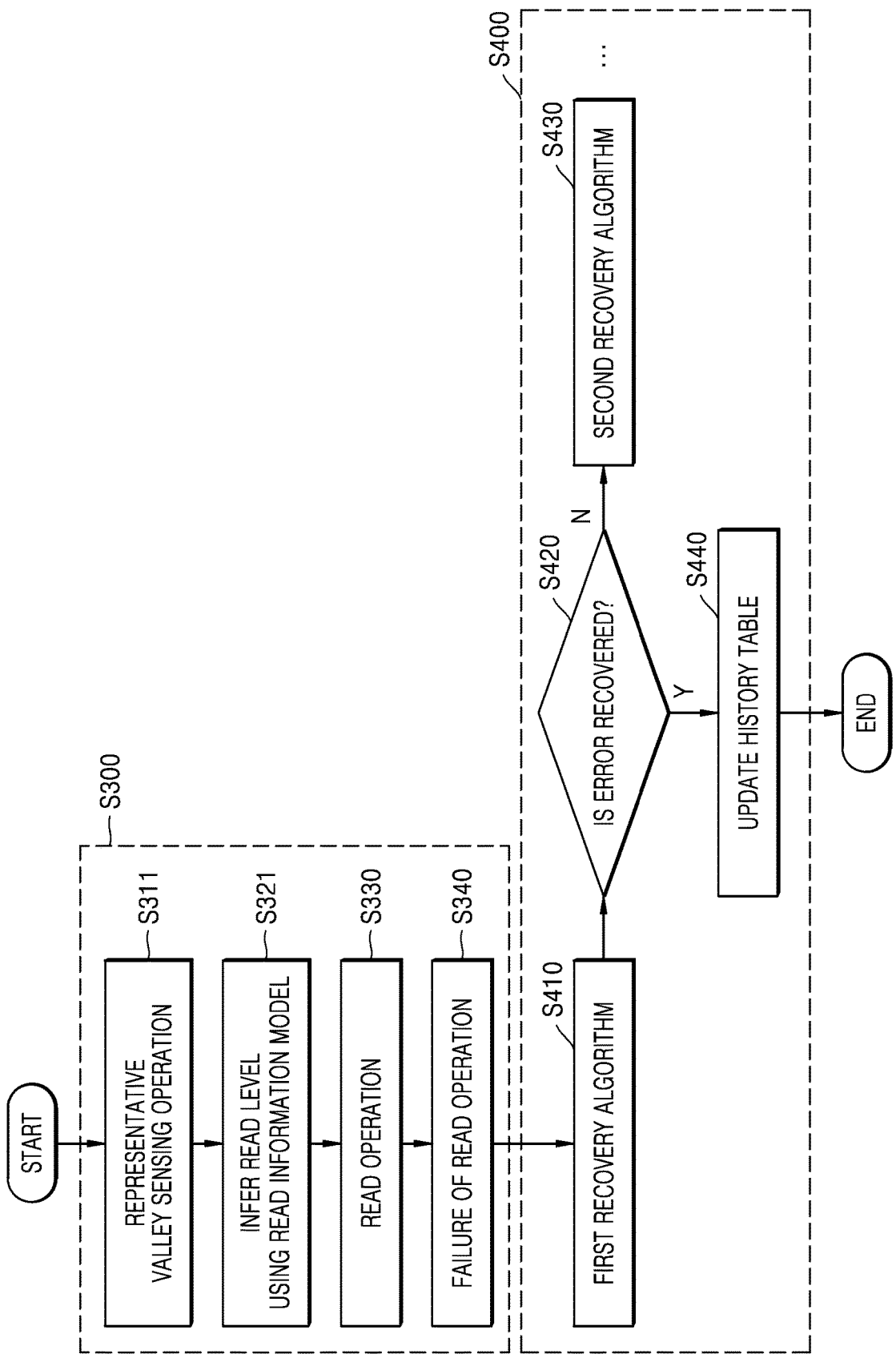
FIGS. 11A to 11C are flowcharts of a method of operating a non-volatile memory device, according to an example embodiment.
Figure 11B:
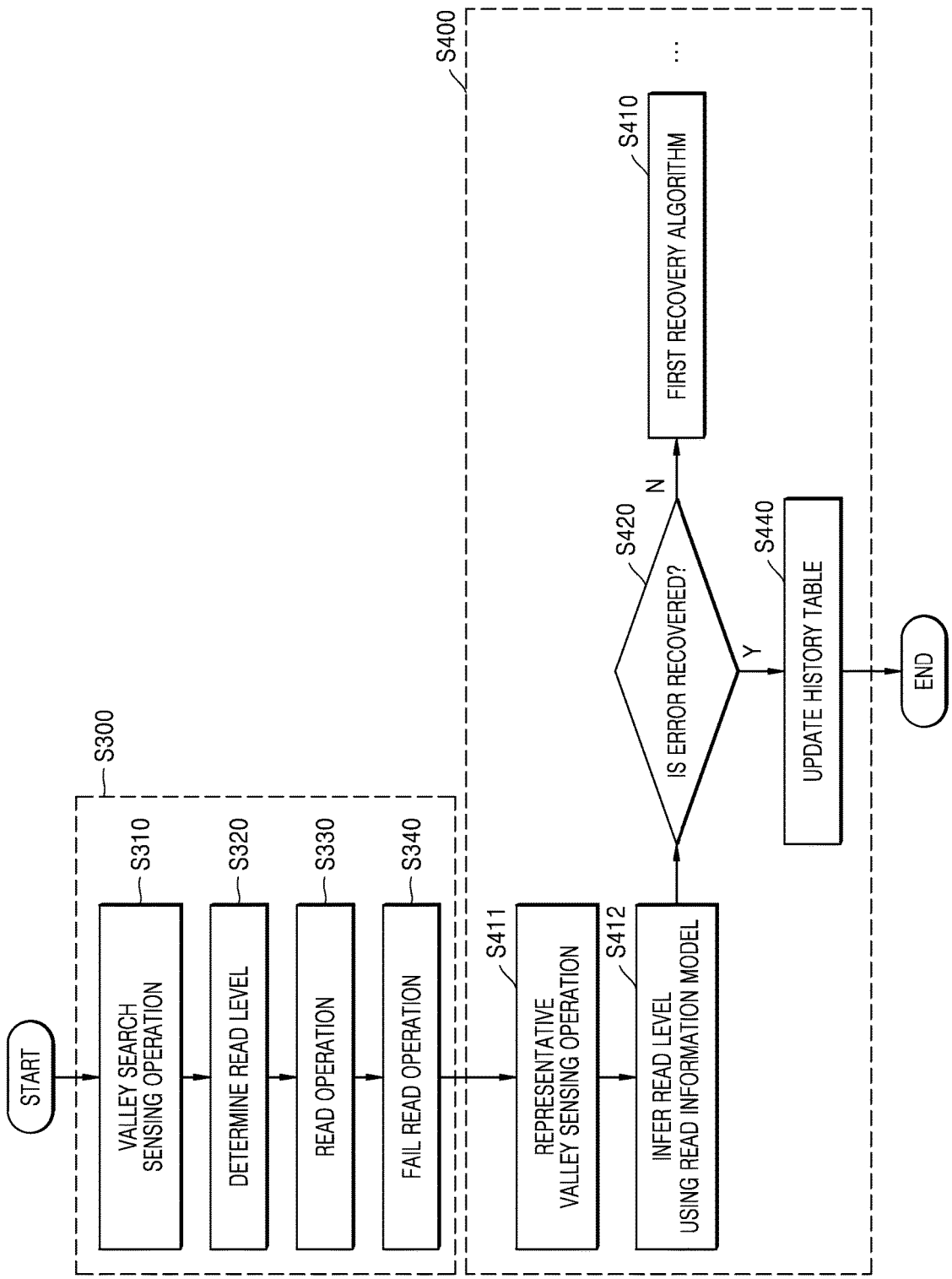
Figure 11C:
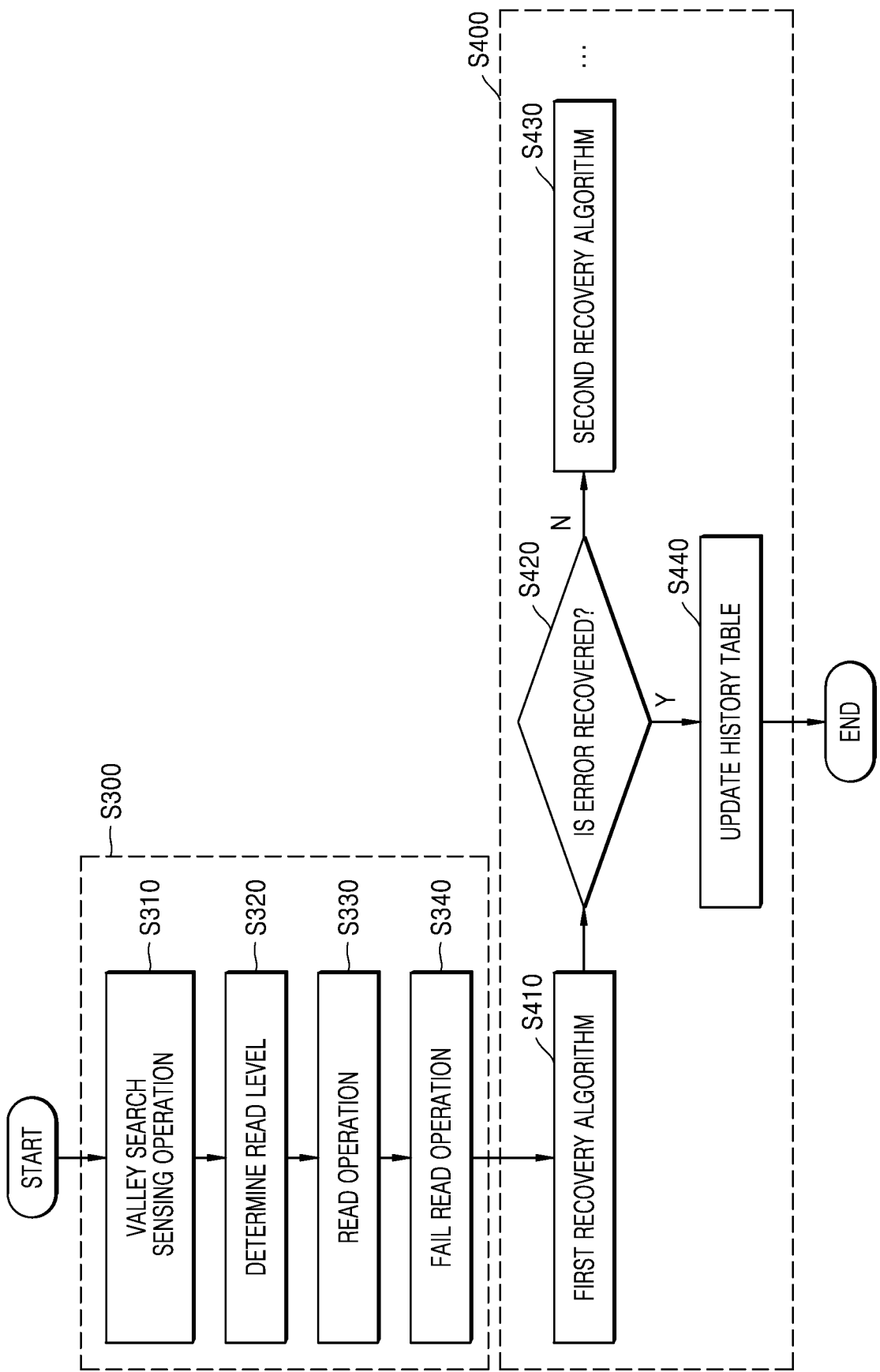

FIGS. 11A to 11C are flowcharts of a method of operating a non-volatile memory device, according to an example embodiment.

An operation of inferring a read level using an ML model may be included in a normal read operation or included in an algorithm execution operation for recovering a read operation when the read operation has failed.

When memory cells are degraded, a distribution of threshold voltages of the memory cells may be changed, and thus, an error may occur in data. To recover the error, a memory device may perform various recovery algorithms by varying an execution time and a recovery rate to detect a portion having a lowest valley in the distribution of the threshold voltages of the memory cells.

Referring to FIG. 11A, in a normal routine S300 of a read operation, a valley sensing operation S311 on a representative valley is performed, and an operation of inferring a read level of at least one valley may be performed S321 using a result from the valley sensing operation S311 on the representative valley and a read information model. In this case, the read information model may be the ML model described with reference to FIGS. 1 to 10. A main sensing operation S330 for the read operation may be performed using the inferred read level. When the read operation has failed and an error occurs S340, the process may enter into a recovery algorithm routine S400. Several recovery algorithms may be provided. A first recovery algorithm S410 having a short execution time and a low recovery rate and a second recovery algorithm S430 having a long execution time and a high recovery rate may be sequentially performed until the error is corrected. For instance, when the error is not recovered using the first recovery algorithm, the recovery algorithm routine S400 may proceed to second recovery algorithm S430. When the error is corrected by the recovery algorithm, the current read level information may be updated in a history table S440. However, the disclosure is not limited to the first recovery algorithm S410 and the second recovery algorithm S430, and as such, according to an example embodiment, other recovery algorithms may be provided in the recovery algorithm routine S400.

Referring to FIG. 11B, a normal routine S300 of a read operation may perform a valley search sensing operation S310 of the related art without using a read information model, determine a read level of each valley S320, and perform a main sensing operation S330 for the read operation. When the read operation has failed and an error occurs S340, the process may enter into a recovery algorithm routine S400. In this case, before a first recovery algorithm S410 is performed, a valley sensing operation S411 may be performed on a representative valley, and an operation S412 of inferring a read level of the representative valley using a read information model may be performed. When the read operation using the inferred read level is successful S420, an additional recovery algorithm may not be performed, and the current read level may be updated in a history table (S440), and the process may end. When the read operation using the inferred read level has failed S420, the process may return to the first recovery algorithm S410, and subsequent operations may be sequentially performed.

FIG. 11C is a flowchart of a read operation of the related art, which does not use a read information model, according to a comparative example. A normal routine S300 of a read operation may perform a valley search sensing operation S310, determine a read level of each valley S320, and perform a main sensing operation S330 for the read operation. When the read operation has failed and an error occurs S340, the process may enter a recovery algorithm routine S400. A recovery algorithm may include sequentially performing a first recovery algorithm S410 having a short execution time and a low recovery rate and performing a second recovery algorithm S430 having a long execution time and a high recovery rate until the error is corrected. When the error is corrected using the recovery algorithm, read level information may be updated in a history table (S440).

Figure 12:
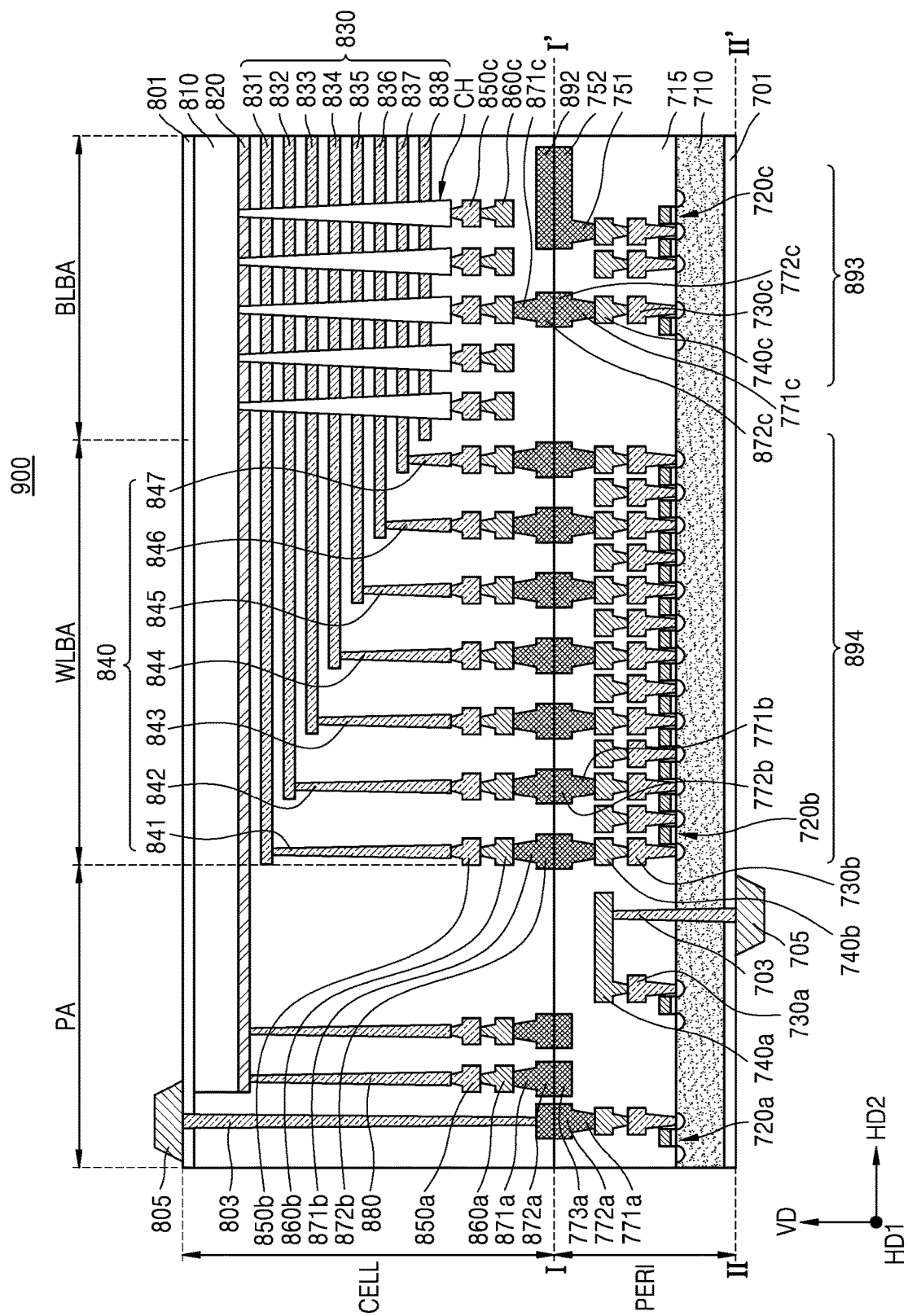
FIG. 12 is a cross-sectional view of a non-volatile memory device according to an example embodiment.

FIG. 12 is a cross-sectional view of a memory device 900 according to an example embodiment.

Referring to FIG. 12, the memory device 900 may include a chip-to-chip (C2C) structure. The C2C structure may refer to a structure in which an upper chip including a cell region CELL is manufactured on a first wafer, a lower chip including a peripheral circuit region PERI is manufactured on a second wafer, which is different from the first wafer, and the upper chip and the lower chip are connected to each other by using a bonding technique. As an example, the bonding technique may refer to a method of electrically connecting a bonding metal formed on an uppermost layer of the upper chip to a bonding metal formed on an uppermost metal layer of the lower chip. For example, when the bonding metal includes copper (Cu), the bonding technique may be a Cu—Cu bonding technique. The bonding metal may include aluminum (Al) or tungsten (W). The embodiments described with reference to FIGS. 1 to 11 may be implemented in the memory device 900. For example, an ML logic including the read information model described with reference to FIGS. 1 to 11 may be in the peripheral circuit region PERI.

Each of the peripheral circuit region PERI and the cell region CELL of the memory device 900 may include an external pad bonding area PA, a word line bonding area WLBA, and a bit line bonding area BLBA. The peripheral circuit region PERI may include a first substrate 710, an interlayer insulating layer 715, a plurality of circuit elements 720a, 720b, and 720c formed in the first substrate 710, first metal layers 730a, 730b, and 730c connected to the plurality of circuit elements 720a, 720b, and 720c, respectively, and second metal layers 740a, 740b, and 740c formed on the first metal layers 730a, 730b, and 730c. In an embodiment, the first metal layers 730a, 730b, and 730c may include tungsten having a relatively high resistance, and the second metal layers 740a, 740b, and 740c may include copper having a relatively low resistance.

Although only the first metal layers 730a, 730b, and 730c and the second metal layers 740a, 740b, and 740c are described and illustrated in the present embodiment, the disclosure is not limited thereto, and at least one metal layer may be further formed on the second metal layers 740a, 740b, and 740c. At least a portion of at least one metal layer formed on the second metal layers 740a, 740b, and 740c may include aluminum having a lower resistance than copper included in the second metal layers 740a, 740b, and 740c. An interlayer insulating layer 715 may be on the first substrate 710 to cover the plurality of circuit elements 720a, 720b, and 720c, the first metal layers 730a, 730b, and 730c, and the second metal layers 740a, 740b, and 740c and include an insulating material, such as silicon oxide and silicon nitride.

Lower bonding metals 771b and 772b may be formed on the second metal layer 740b of the word line bonding area WLBA. In the word line bonding area WLBA, the lower bonding metals 771b and 772b of the peripheral circuit region PERI may be electrically connected to upper bonding metals 871b and 872b of the cell region CELL by using a bonding technique, and the lower bonding metals 771b and 772b and the upper bonding metals 871b and 872b may include aluminum, copper, or tungsten. The upper bonding metals 871b and 872b of the cell region CELL may be referred to as first metal pads, and the lower bonding metals 771b and 772b of the peripheral circuit region PERI may be referred to as second metal pads.

The cell region CELL may provide at least one memory block. The cell region CELL may include a second substrate 810 and a common source line 820. A plurality of word lines 831 to 838 (or 830) may be stacked on the second substrate 810 in a vertical direction VD to an upper surface of the second substrate 810. String selection lines and a ground selection line may be respectively on and under the word lines 830, and the plurality of word lines 830 may be between the string selection lines and the ground selection line.

In the bit line bonding area BLBA, a channel structure CH may extend in the vertical direction VD to the upper surface of the second substrate 810 and pass through the word lines 830, the string selection lines, and the ground selection line. The channel structure CH may include a data storage layer, a channel layer, and a buried insulating layer, and the channel layer may be electrically connected to a first metal layer 850c and a second metal layer 860c. For example, the first metal layer 850c may be also referred to as a bit line contact, and the second metal layer 860c may be also referred to as a bit line. In an embodiment, the bit line 860c may extend in a first lateral direction HD1 parallel to the upper surface of the second substrate 810.

In an embodiment shown in FIG. 12, an area in which the channel structure CH and the bit line 860c are disposed may be defined as the bit line bonding area BLBA. In the bit line bonding area BLBA, the bit line 860c may be electrically connected to the circuit elements 720c, which provide a page buffer 893 in the peripheral circuit region PERI. As an example, the bit line 860c may be connected to upper bonding metals 871c and 872c in the peripheral circuit region PERI, and the upper bonding metals 871c and 872c may be connected to lower bonding metals 771c and 772c connected to the circuit elements 720c of the page buffer 893.

In the word line bonding area WLBA, the word lines 830 may extend in a second lateral direction HD2 parallel to the upper surface of the second substrate 810 and be connected to a plurality of cell contact plugs 841 to 847 (or 840). The word lines 830 may be connected to the cell contact plugs 840 at pads where at least some of the word lines 830 extend by different lengths in the second lateral direction HD2. A first metal layer 850b and a second metal layer 860b may be sequentially connected to and located on the cell contact plugs 840 connected to the word lines 830. In the line bonding area WLBA, the cell contact plugs 840 may be connected to the peripheral circuit region PERI through the upper bonding metals 871b and 872b of the cell region CELL and the lower bonding metals 771b and 772b of the peripheral circuit region PERI.

The cell contact plugs 840 may be electrically connected to the circuit elements 720b configured to provide a row decoder 894 in the peripheral circuit region PERI. In an embodiment, an operating voltage of the circuit elements 720b configured to provide the row decoder 894 may be different from an operating voltage of the circuit elements 720c configured to provide the page buffer 893. As an example, the operating voltage of the circuit elements 720c configured to provide the page buffer 893 may be higher than the operating voltage of the circuit elements 720b configured to provide the row decoder 894.

A common source line contact plug 880 may be in the external pad bonding area PA. The common source line contact plug 880 may include a conductive material, such as a metal, a metal compound, or polysilicon and be electrically connected to the common source line 820. A first metal layer 850a and a second metal layer 860a may be sequentially stacked on the common source line contact plug 880. As an example, an area in which the common source line contact plug 880, the first metal layer 850a, and the second metal layer 860a are arranged may be defined as the external pad bonding area PA.

Moreover, first and second I/O pads 705 and 805 may be in the external pad bonding area PA. Referring to FIG. 12, a lower insulating film 701 may be formed under the first substrate 710 to cover a lower surface of the first substrate 710, and the first I/O pad 705 may be formed on the lower insulating film 701. The first I/O pad 705 may be connected to at least one of the plurality of circuit elements 720a, 720b, and 720c, which are in the peripheral circuit region PERI, through a first I/O contact plug 703 and isolated from the first substrate 710 by the lower insulating film 701. Furthermore, a side insulating film may be between the first I/O contact plug 703 and the first substrate 710 and electrically isolate the first I/O contact plug 703 from the first substrate 710.

Referring to FIG. 12, an upper insulating film 801 may be formed on the second substrate 810 to cover an upper surface of the second substrate 810, and the second I/O pad 805 may be on the upper insulating film 801. The second I/O pad 805 may be connected to at least one of the plurality of circuit elements 720a, 720b, and 720c arranged in the peripheral circuit PERI through a second I/O contact plug 803.

In some embodiments, the second substrate 810 and the common source line 820 may not be in a region in which the second I/O contact plug 803 is disposed. Also, the second I/O pad 805 may not overlap the word lines 830 in a third direction (Z-axial direction). Referring to FIG. 12, the second I/O contact plug 803 may be isolated from the second substrate 810 in a direction parallel to the upper surface of the second substrate 810 and connected to the second I/O pad 805 through an interlayer insulating layer 815 of the cell region CELL.

In some embodiments, the first I/O pad 705 and the second I/O pad 805 may be optionally formed. As an example, the memory device 900 may include only the first I/O pad 705 disposed over the first substrate 710 or include only the second I/O pad 805 disposed over the second substrate 810. Alternatively, the memory device 900 may include both the first I/O pad 705 and the second I/O pad 805.

In the external pad bonding area PA and the bit line bonding area BLBA, which are respectively included in the cell region CELL and the peripheral circuit region PERI, a metal pattern of an uppermost metal layer may serve as a dummy pattern or the uppermost metal layer may be absent.

In the external pad bonding area PA of the memory device 900, a lower metal pattern 773a having the same shape as an upper metal pattern 872a of the cell region CELL may be formed in the uppermost metal layer of the peripheral circuit region PERI to correspond to the upper metal pattern 872a formed in the uppermost metal layer of the cell region CELL. The lower metal pattern 773a formed in the uppermost metal layer of the peripheral circuit region PERI may not be connected to an additional contact in the peripheral circuit region PERI. Similarly, in the external pad bonding area PA, an upper metal pattern having the same shape as a lower metal pattern of the peripheral circuit region PERI may be formed in an upper metal layer of the cell region CELL to correspond to a lower metal pattern formed in the uppermost metal layer of the peripheral circuit region PERI.

The lower bonding metals 771b and 772b may be formed on the second metal layer 740b in the word line bonding area WLBA. In the word line bonding area WLBA, the lower bonding metals 771b and 772b of the peripheral circuit region PERI may be electrically connected to the upper bonding metal 871b and 872b of the cell region CELL by using a bonding technique. In the bit line bonding area BLBA, an upper metal pattern 892 having the same shape as a lower metal pattern 752 of the peripheral circuit region PERI may be formed in the uppermost metal layer of the cell region CELL to correspond to the lower metal pattern 752 formed in the uppermost metal layer of the peripheral circuit region PERI. A contact may not be formed on the upper metal pattern 892 formed in the uppermost metal layer of the cell region CELL.

Figure 13:
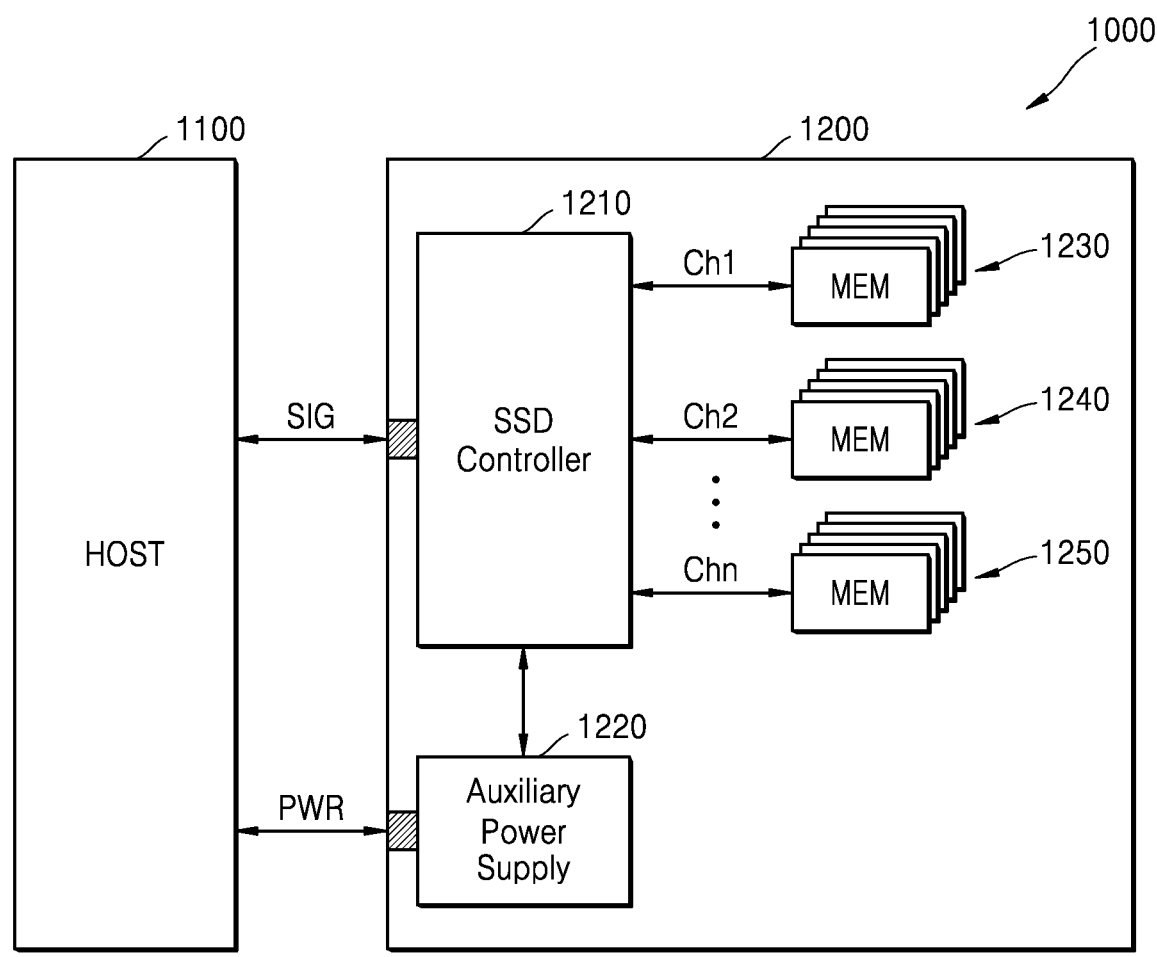
FIG. 13 is a block diagram of an example of applying a non-volatile memory device according to example embodiments to a solid-state drive (SSD) system.

FIG. 13 is a block diagram of an example of applying a memory device according to example embodiments to a solid-state drive (SSD) system 1000. Referring to FIG. 13, the SSD system 1000 may include a host 1100 and an SSD 1200. The SSD 1200 may include an SSD controller 1210, an auxiliary power supply 1220, and memory devices (or MEM) 1230, 1240, and 1250. The memory devices 1230, 1240, and 1250 may be a VNAND flash memory device. In this case, the SSD 1200 may be implemented with reference to the embodiments described with reference to FIGS. 1 to 13. According to an example embodiment, the SSD Controller 1210 may be connected to the memory devices 1230, 1240 and 1250 through channels Ch1, Ch2 and Chn. Moreover, the hold 110 and the SSD 1220 may be connected to each other through signal lines (SIG) and power lines (PWR). However, the disclosure is not limited thereto.

While the disclosure has been particularly shown and described with reference to embodiments thereof, it will be understood that various changes in form and details may be made therein without departing from the spirit and scope of the following claims.

What is claimed is:

1. A non-volatile memory device comprising:
   a memory cell array comprising memory cells;
   a page buffer circuit comprising page buffers respectively connected to bit lines;
   a buffer memory; and
   a control logic configured to:
      obtain valley search detection information including read target block information and word line information by performing a valley search sensing operation on a distribution of threshold voltages of the memory cells,
      obtain a plurality of read levels using a read information model by inputting the valley search detection information into the read information model, and
      perform a main sensing operation for a read operation based on the plurality of read levels,
   wherein the read information model is trained using a machine learning model by inputting the valley search detection information into the machine learning model, and the read information model infers the plurality of read levels for reading data from the memory cells.

2. The non-volatile memory device of claim 1, wherein the control logic is further configured to generate the valley search detection information by performing the valley search sensing operation on a first read level, and inferring a second read level using the read information model by inputting the valley search detection information into the read information model.

3. The non-volatile memory device of claim 1, wherein the valley search sensing operation comprises counting a first number of memory cells included in a first region having a first threshold voltage lower than a reference value of a first read level, counting a second number of memory cells included in a second region having a second threshold voltage higher than the reference value of the first read level, and calculating an optimum offset value of the first read level by comparing the first number with the second number.

4. The non-volatile memory device of claim 3, wherein the read information model is trained using the machine learning model by inputting the read target block information, the word line information, the first number, and the second number into the machine learning model, and the read information model infers the plurality of read levels for the reading the data from the memory cells.

5. The non-volatile memory device of claim 1, wherein the read information model uses at least one of a decision tree, a neural network, a support vector machine, and linear regression.

6. The non-volatile memory device of claim 1, wherein the buffer memory comprises a history table configured to store the plurality of read levels.

7. The non-volatile memory device of claim 1, wherein, in a read recovery operation performed when the read operation has failed, the control logic is further configured to generate the valley search detection information by performing the valley search sensing operation on a first read level, and inferring a second read level using the read information model by inputting the valley search detection information into the read information model.

8. The non-volatile memory device of claim 1, wherein the read information model is trained to infer an individual read level of the memory cell array, a read level of each page, or an entire read level of the memory cell array.

9. The non-volatile memory device of claim 1, wherein the read information model is trained based on at least one piece of target memory block information, target page information, target word line information, timestamp information, program and erase number information, read count information, inferred read level information, read operation error information, or information about a read recovery operation performed when the read operation has failed.

10. A memory system comprising:
a non-volatile memory device configured to:
obtain valley search detection information including read target block information and word line information by performing a valley search sensing operation on a distribution of threshold voltages of memory cells during a read operation on the memory cells,
obtain a plurality of read levels using a read information model by inputting the valley search detection information into the read information model, and
perform a main sensing operation for the read operation based on the plurality of read levels; and
a computing device configured to train the read information model using a machine learning model by inputting the valley search detection information into the machine learning model, and inferring the plurality of read levels for reading data from the memory cells.

11. The memory system of claim 10, wherein training data of the read information model comprises at least one piece of target memory block information, target page information, target word line information, timestamp information, program and erase number information, read count information, inferred read level information, read operation error information, or information about a read recovery operation that is executed when the read operation has failed.

12. The memory system of claim 10, wherein the read information model is trained to infer an individual read level of a memory cell, a read level of each page, or an entire read level of the memory cell.

13. The memory system of claim 10, wherein the computing device is further configured to infer a second read level based on valley search detection information about a first read level generated by performing the valley search sensing operation using the read information model.

14. The memory system of claim 10, wherein the valley search sensing operation comprises counting a first number of memory cells included in a first region having a first threshold voltage lower than a reference value of a first read level, counting a second number of memory cells included in a second region having a second threshold voltage higher than the reference value of the first read level, and calculating an optimum offset value of the first read level by comparing the first number with the second number.

15. A method of operating a non-volatile memory device comprising a plurality of memory cells, the method comprising:

obtaining valley search detection information including read target block information and word line information by performing a valley search sensing operation on a distribution of threshold voltages of the memory cells;
obtaining a plurality of read levels using a read information model by inputting the valley search detection information into the read information model; and
performing a main sensing operation for a read operation based on the plurality of read levels,
wherein the read information model is trained using a machine learning model by inputting the valley search detection information into the machine learning model, and the read information model infers the plurality of read levels for reading data of the memory cells.

16. The method of claim 15, wherein the obtaining of the valley search detection information is performed to determine a first read level, and
the inferring of the plurality of read levels comprises inferring a second read level using the read information model based on the valley search detection information about the first read level.

17. The method of claim 15, wherein the valley search sensing operation comprises counting a first number of memory cells included in a first region having a first threshold voltage lower than a reference value of a first read level, counting a second number of memory cells included in a second region having a second threshold voltage higher than the reference value of the first read level, and calculating an optimum offset value of the first read level by comparing the first number with the second number.

18. The method of claim 17, wherein the read information model is trained using the machine learning model by inputting the read target block information, the word line information, the first number, and the second number into the machine learning model, and the read information model infers the plurality of read levels for the reading the data from the memory cells.

19. The method of claim 15, in a read recovery operation performed when the read operation has failed, the method further comprising obtaining the valley search detection information by performing the valley search sensing operation on a first read level, inferring a second read level using the read information model by inputting the valley search detection information into the read information model, and storing the second read level in a history table.

\* \* \* \* \*